(12) United States Patent
Hipp

(10) Patent No.: US 6,751,279 B1
(45) Date of Patent: Jun. 15, 2004

(54) ARRANGEMENT FOR CLOCK SUPPLY OF HIGH BIT RATE SWITCHING NETWORK STRUCTURES

(75) Inventor: Imre Hipp, Munich (DE)

(73) Assignee: Siemens Aktiengellschaft, Munich (DE)

(*) Notice: Subject to any disclaimer, the term of this patent is extended or adjusted under 35 U.S.C. 154(b) by 654 days.

(21) Appl. No.: 09/658,646

(22) Filed: Sep. 11, 2000

(30) Foreign Application Priority Data

Sep. 9, 1999 (DE) .......................... 199 43 172

(51) Int. Cl.[7] .............................................. H03D 3/24
(52) U.S. Cl. ................................. 375/376; 331/50
(58) Field of Search .................... 331/50, 60; 370/503; 326/66; 375/354, 356, 357, 359, 371, 376

(56) References Cited

U.S. PATENT DOCUMENTS

| 4,590,439 A | * | 5/1986 | Goggin ...................... 331/1 A |
| 5,479,115 A | * | 12/1995 | Ueda et al. ................... 326/63 |
| 5,631,591 A | * | 5/1997 | Bar-Niv ....................... 327/158 |
| 6,111,712 A | * | 8/2000 | Vishakhadatta et al. ...... 360/51 |

* cited by examiner

Primary Examiner—Stephen Chin
Assistant Examiner—Jason M Perilla
(74) Attorney, Agent, or Firm—Shaw Pittman LLP

(57) ABSTRACT

The invention is directed to an arrangement for clock supply of a high bit-rate switching network structures in a digital narrowband switching system such as EWSD. A clock frequency signal (CLK2) traditionally generated with a crystal-controlled oscillator (11) as well as a corresponding frame clock signal (FMB2) are converted into low-voltage CMOS level signals and supplied to a system PLL (2) for high frequencies. This contains a discretely constructed VCO 6 with a sine oscillator that derives a higher-frequency signal from the supplied clock signal and converts this into a high-frequency clock signal (CLK92) of the output side. A feedback signal derived in this part serves as an input-side feedback signal for a phase detector (8) in low-voltage CMOS technology. The feedback signal as well as the output-side high-frequency signal (CLK92) also serve for phase decoupling of the input-side frame clock signal (FMB2) from the output-side frame clock signal (FMB92) and for the phase-coupling thereof to the output-side high-frequency signal (CLK92). The output-side clock signals (CLK92, FMB92) are distributed in pairs via a clock distribution system (3) dimensioned within narrow tolerances and are supplied to respective application-specific or customized ICs (4) in low-voltage CMOS technology. This division onto various stages and onto components of different technologies in low-voltage technology allow the dimensioning and configuration with cost-beneficial components.

13 Claims, 3 Drawing Sheets

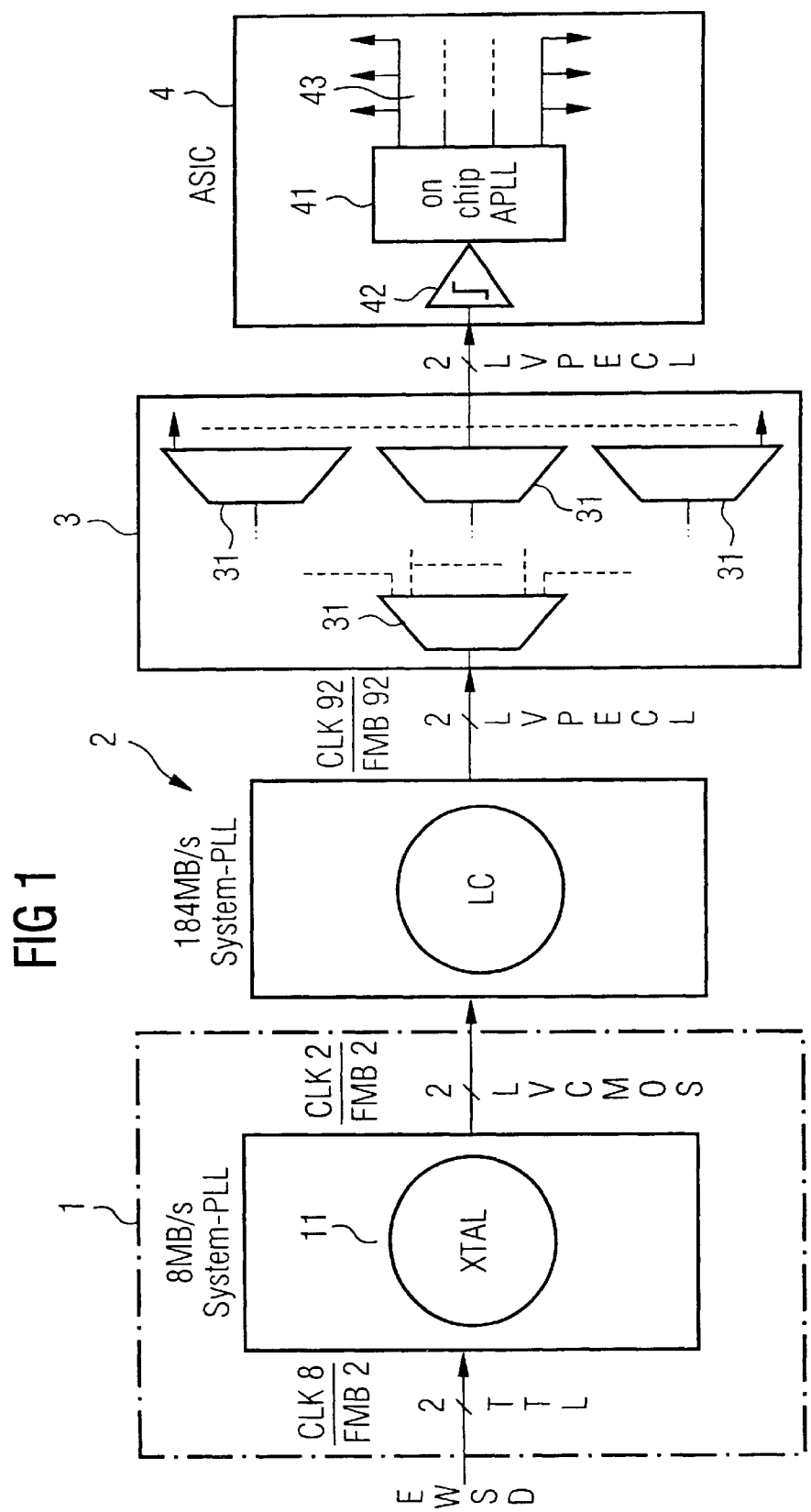

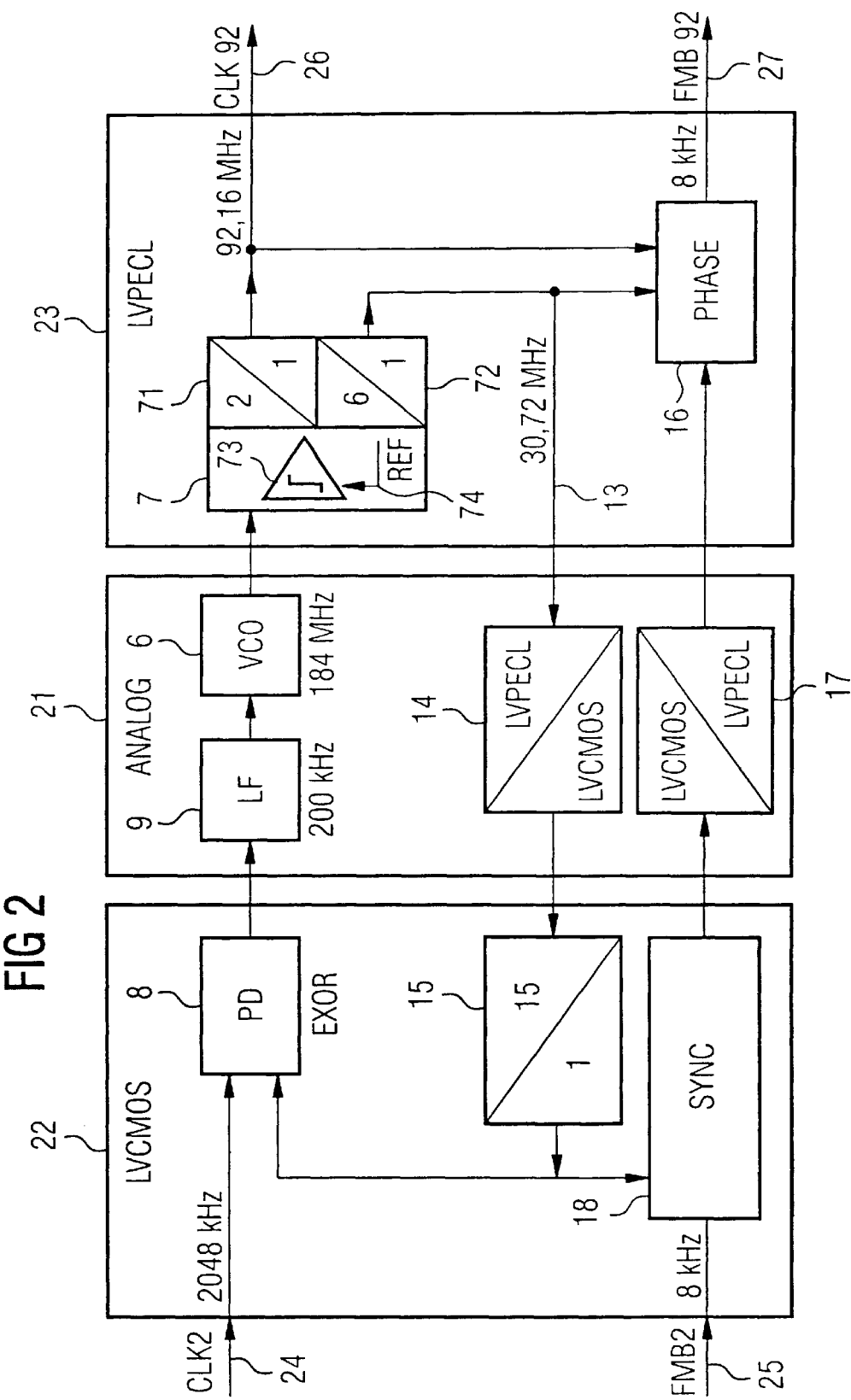

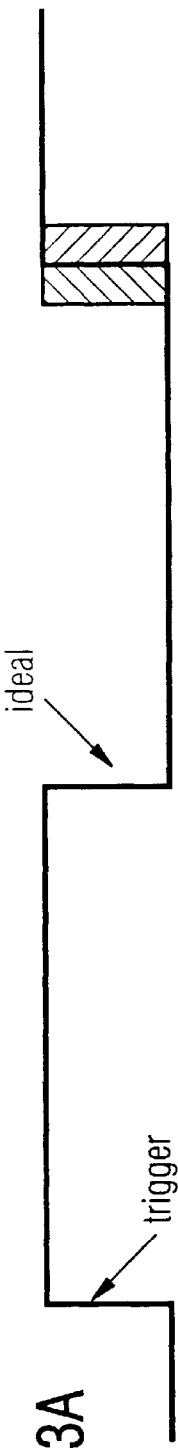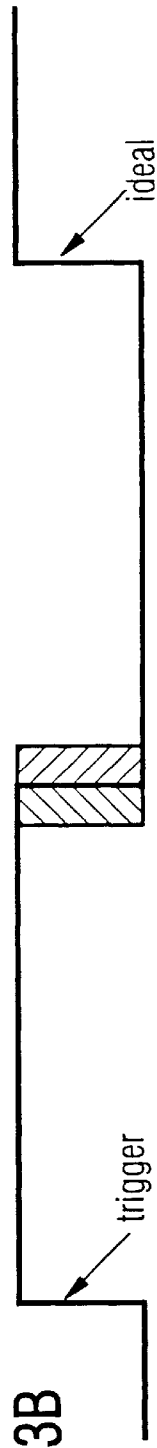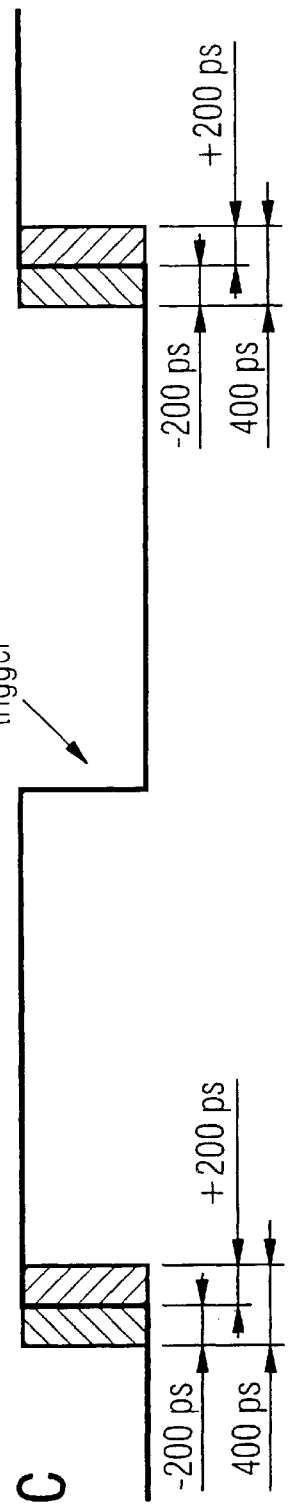

ARRANGEMENT FOR CLOCK SUPPLY OF HIGH BIT RATE SWITCHING NETWORK STRUCTURES

BACKGROUND OF THE INVENTION

1. Field of the Invention

The invention is directed to an arrangement for a clock supply of high bit rate switching network structures in a digital narrowband switching system such as EWSD with a PLL system comprising a crystal-controlled oscillator.

2. Description of the Related Art

The previously mentioned switching networks work with a transmission speed of (128×64 kB/s)=8.192 MB/s (colloquially, "8 MB/s"). In such switching networks, the required synchronizing clock is achieved proceeding from a centrally generated 8 MHz system clock, namely with rigid synchronism. The necessary frame positions are also defined and forced in the various switching stages by a frame clock FMB2 that is generated phase-locked relative to the 8 MHz system clock. Due to the adequate phase reserves at the data interfaces, a synchronization on site is not required. Jitter problems are not critical; on the contrary, the jitter demands made of the generated system parts lie in the easily doable range. Traditionally, a PLL system employing a commercially obtainable crystal-controlled oscillator is used. The PLL system is provided in order to assure the phase-locked linking of the switching network clock to the clock that is generated by the central clock generator, the crystal-controlled oscillator, and converted. The required 8 MHz system clock, CLK8, and the 2 KHz frame marking or the 2 KHz frame clock, FMB2, are offered on symmetrical lines in the narrowband switching system at the traditional TTL level. The stable crystal-controlled oscillator of the PLL system achieves high-quality phase and frequency stability.

High bit rate switching network structures, however, must work with significantly higher serving speeds. It is desirable to have a serving speed of (2304×80 kB/s)=184.320 MB/s ("184 MB/s"), which could use correspondingly dimensioned crystal-controlled oscillators. Crystals that oscillate with the required frequencies, however, are extremely expensive, by which only the harmonics can be employed. Moreover, a central circuit-synchronous clock can no longer be employed for distribution-oriented reasons. The necessity of having to adhere to an extremely narrow frequency follow-up range is also disadvantageous.

It must be taken into consideration that clock signal edges having a spacing of 0.7 ns must be selected, by which a high-frequency phase stability of 300–400 ps (peak-to-peak) must be achieved to reliably function and to consider unavoidable jitter accumulation at the various transitions.

SUMMARY OF THE INVENTION

Thus, an object of the present invention is to specify an arrangement for a clock supply of high bit rate switching network structures with which high phase and frequency stability can also be assured in the high-frequency range.

This object is achieved by an arrangement for a clock supply of high bit-rate switching network structures in a digital narrowband switching system, comprising: a PLL system comprising a crystal-controlled oscillator that locks the switching network clock to a clock phase generated by a central clock generator and outputs a low-voltage normal bit-rate, low frequency, clock signal and a low-voltage frame clock signal for normal bit-rate switching network structures; an analog, discrete sine oscillator in a phase-locked loop that converts the normal bit-rate clock signal into a high-frequency clock signal; and a low-voltage pseudo-ECL arrangement, that, after stabilization with a reference clock, generates a high bit-rate, high frequency, clock signal suitable for high bit-rate switching network structures by division and outputs it, the low-voltage pseudo-ECL arrangement also outputting an output-side high bit-rate, high frequency, frame clock signal of the same frequency decoupled in phase position from an input-side frame clock signal that has a predetermined phase relation relative to the high bit-rate output-side clock signal. The arrangement may further comprise a feedback path via which a clock signal, that is a feedback signal, that has been stepped-down in frequency as well as converted in level can be fed back to an input-side phase detector contained within a low-voltage CMOS arrangement that also receives the input-side normal bit-rate clock signal. The arrangement may also comprise an ultra-fast comparator with a high analog gain, the ultra-fast comparator comprising a following, integrated frequency divider with two differing division rates for an output of the high bit-rate output-side clock signal and of the feedback signal. The comparator may have a high steepness for a sine signal in a zero-axis crossing at a steepness of approximately 1V/ns. This arrangement may further comprise a level converter in the feedback path, the level converter consisting of passive components and serving for a conversion of low-voltage pseudo-ECL level onto low-voltage CMOS level. The phase detector may comprise an exclusive-OR element; and a step-down device in the low-voltage CMOS structure may be provided in the form of an electrically programmable gate array that further-converts the feedback and level-converted signal into a signal having a pulse-duty factor 1:1 that is supplied to the exclusive-OR element.

The arrangement may further comprise a two-stage, passive low-pass filter preceding the analog sine oscillator and having a −3 dB limit frequency of at least 2 times the corner frequency of a pure proportion control element part of a control loop of the arrangement without a low-pass filter. It also may comprise a clock distributor arrangement in the low-voltage pseudo-ECL arrangement that receives the high bit-rate clock signal and the high bit-rate frame clock signal coupled to it in phase position at its input side and divides these in pairs onto numerous output pairs. The arrangement may further comprise low-voltage pseudo-ECL components with low skew that are selected such that a required system jitter that is reached in the low-voltage pseudo-ECL arrangement, the low-voltage CMOS arrangement, and the clock distributor arrangement lies on the order of magnitude of ±200 ps. The arrangement may further comprise a low-voltage ASIC in a low-voltage CMOS arrangement, the ASIC having integrated into it: a gate array arrangement; an analog PLL; and a comparator that is supplied by the high bit-rate clock signal and the high bit-rate frame clock signal coupled to it in phase position, the comparator having difference outputs that supply the analog PLL for converting an input-side clock frequency to double that and for, in turn, its distribution of this clock frequency with the gate array arrangement. In the arrangement, the low-frequency clock signal frequency may be approximately 2048 KHz; the output side high-frequency clock frequency may be approximately 92.162 MHz; and the high frequency frame clock signal frequency may be approximately 8 KHz.

The invention is based on the idea that the noise influence as well as the creation and accumulation of jitter in the overall clock path can be kept low with a suitable selection and dimensioning of component parts. This, on the one hand, is based on the use of low-voltage technology (in the area of 3.3 V) in the high-frequency level, particularly a low-voltage CMOS technology and a low-voltage pseudo-ECL technology. Critical sources of noise influences or sources for the creation of jitter can thus be eliminated to the farthest-reaching extent. Critical noise sources in the high-frequency range are the supply voltage, the signal level employed, the edge steepness, the entire signal spectrum, and high-impedance components.

BRIEF DESCRIPTION OF THE DRAWINGS

The invention is explained in greater detail on the basis of the exemplary embodiment shown in the drawings, in which Low-voltage systems are prefixed with LV.

FIG. 1 is a schematic block diagram illustrating the arrangement of the various function stages of the clock supply arrangement according to the invention;

FIG. 2 is a schematic block diagram illustrating the fundamental structure of the second function stage that implements the conversion of the switching network clock into the high-frequency level; and FIGS. 3a–3c are timing diagrams illustrating unavoidable jitter or skew problems that must be considered.

DESCRIPTION OF THE PREFERRED EMBODIMENTS

FIG. 1 shows the four function stages of the inventive arrangement. An 8 MB/s system PLL is provided in the first function stage 1, as can also be a component part of current 8MB/s switching networks. This PLL serves the purpose of providing the necessary phase-locked linking of the switching network clock to the clock generated by a central clock generator (not shown in detail) and converted in a message distributor (likewise not shown in detail) for narrowband switching systems like EWSD (digital electronic dialing system). In this first function stage 1, an 8 MHz system clock CLK8 and a 2 KHz frame marking FMB2 or a 2 KHz frame clock are generated. The two clock signals are offered on symmetrical lines in the digital narrowband switching system in levels that are standard in TTL systems. The phase-locked loop PLL works with a stable crystal-controlled oscillator 11 (XTAL) in order to assure the required high-quality phase and frequency stability. It is expedient when the PLL also has a very good holdover function available to it in order to improve the outage reliability of the system. For the inventive arrangement, the first function stage 1 makes a clock signal CLK2 with 2048 KHz available at the output side as well as the frame clock signal FMB2 with 8 KHz, namely on a low-voltage level of a type standard for CMOS systems, for instance at 3.3 Volts.

The second function stage 2 comprises a 184 MB/s system PLL with which the switching network clock supplied from the first function stage 1 is converted into the required high-frequency clock signals. As explained in greater detail later with reference to FIG. 2, the second function stage 2 contains, in particular, an extremely low-jitter PLL with a 185 MHz sine oscillator that employs discrete components (LC in FIG. 1). At its output side, the second function stage 2 output a high-frequency clock signal CLK92 with 92.16 MHz and a frame clock signal FMB92 with 8 KHz that is decoupled from the frame clock signal FMB2 of the input side. The clock signals are offered on a low-voltage level that is standard for pseudo-ECL systems (PECL), for instance (likewise) in the 3.3 Volt range.

The third function stage 3 contains the clock distribution system (often also referred to as a clock tree) within the affected switching network, and the clock distribution system is expediently constructed with a maximum of five stages and supplies a further eight assemblies having respectively 24 application-specific or customer-specific ICs (ASIC) with the 92 MHz system clock signal (CLK92) and the 8 KHz frame clock signal (FMB92).

Individual clock modules 31 in low-voltage pseudo-ECL format that are specifically selected in view of their skew properties are provided within the clock distribution system. Furthermore, the line guidance within the third function stage 3 is carefully implemented. This line guidance through the structure ensues both serially as well as parallel. For line guidance adapted serially and parallel Zo-wise, extremely low signal distortion is achieved from the input of the third function stage 3 up to its output. In order to achieve an optimally beneficial run time synchronism between the two clock signals CLK92 and FMB92 of the input side that has considerable positive influence on the skew behavior, these clock signals within the clock distribution system are respectively conducted in pairs within each and every individual clock module 31.

The fourth function stage 4 is formed by the application-specific or customized IC arrangement (ASIC) that receives the two symmetrical clock signals CLK92 and FMB92 output in pairs by the clock distribution system.

The fourth function stage 4 first contains an analog PLL 41 (APLL), namely in module structure on the same chip. In the form of an ASIC macro, this analog PLL achieves an optimum handover in the fashion of an interface of the two high-frequency clocks to a gate array arrangement 43 in a low-voltage CMOS structure, where the gate arrangement is expediently designed for fast signal processing. The integrated analog PLL again transforms the received clock frequency by a specific factor (two, in the exemplary embodiment) in order to obtain the ultimately desired clock signal, 184.320 MB/s here, that can then be exactly distributed within the ASIC with the gate array.

In order to avoid threshold noise or input jitter and distortion of the pulse-duty factor in the acceptance of the two externally supplied clock signals, it is expedient to provide a pseudo-ECL cell 42 in difference circuitry at the input side.

As a result of this more or less indirect distribution of the high clock frequencies that is effected by the transformation in the ASIC of the fourth function stage, the tolerance or capability of tolerancing is greatly improved for cross-overs and in the power balance. As a result of this transformation, i.e., of the step-up of the frequency on the chip, it is possible to generate equidistant edge spacings in such a specific ASIC macro, even for the high system clock frequencies, which is of critical importance for phase aligners.

The dependable function and the dependable collaboration of the various ASICs in CMOS structure for the very high data rates of 148.320 MB/s is effected according to the inventive arrangement in that the occurrence of noise and the accumulation of noise, particularly of jitter, is kept extremely low in the overall clock signal transmission path, this being accomplished by a suitable selection and matching as well as dimensioning of the components.

The supply voltage, the signal level, the signal spectrum, the edge steepness, the system-conditioned jitter in a PLL, the consideration of noise-sensitive, high-impedance locations in the arrangement, as well as the Zo-adapted signal guidance are to be particularly viewed as noise sources or as sources for the creation of jitter.

Proceeding from the boundary conditions to be considered in view of the ASIC (i.e., the corresponding manufacturing tolerance that are allowed in the development of an ASIC) the demands made of the system jitter and the signal distortion (i.e., the pulse-duty factor of the square-wave signals) for the second function stage 2, and the consideration of accumulation of the jitter and signal distortions at the various transitions within the clock distribution system according to the third function stage 3 can be derived. This is presented in greater detail with reference to FIG. 3. What can be derived from these particulars is that a range of ±200 ps must be adhered to both for the jitter of the active clock edges as well as for the pulse-duty factor of the clock signal to be generated with a given ASIC technology in order to also be able to assure a dependable and sure function under unfavorable conditions.

FIG. 3b shows the ideal pulse-duty factor of the individual clock cycles and the corresponding signal distortions. The two noises cannot be mensurationally separated from one another; on the contrary, only the aggregate jitter can be mensurationally detected with reasonable outlay by evaluating successive sequences of clock pulses, for instance, as shown in FIG. 2 in which the tolerance limits or admissibility limits are also indicated.

The above implies that the structure of the second function stage 2 is particularly significant in conjunction with the considerations regarding the third and fourth function stages 3, 4.

The basic structure of the second function stage 2 is now explained in greater detail with reference to FIG. 2.

First, the second function stage 2 comprises the analog or discrete part 21 with a sine oscillator, indicated in FIG. 1 with reference character LC. Furthermore, a low-voltage CMOS part 22 and a low-voltage pseudo-ECL part 23 are provided.

At its input side via lines 24 or 25, the low-voltage CMOS part 22 receives the clock signal CLK2 with 2048 KHz and the frame marking signal or frame clock signal FMB2 with 8 KHz output by the first function stage. At its outputs side via lines 26 and 27, the low-voltage pseudo-ECL part 23 outputs the high-frequency clock signal CLK92 with 92.16 MHz and the frame marking signal or frame clock signal FMB92, likewise with 8 KHz.

The clock signal CLK2 supplied via the line 24 is supplied to a phase detector 8 (PD) constructed in the form of an exclusive-OR element in the low-voltage CMOS part 22. Its output signal enters via a low-pass filter 9 (LF) with a limit frequency of 200 KHz into a discretely constructed VCO 6. Its output signal with 184 MHz is an input signal of a comparator 73 of a converter 7 in the low-voltage ECL part 23. The comparator 73 compares to an internal reference signal 74 and outputs its output signal to two dividers 71 and 72. Here, the divider 71 is a 1:2 divider that outputs a signal with the frequency 92.16 MHz at its output side as clock signal CLK92 via the line 72. The other divider 72 is a 1:6 divider that feeds an output signal with 30.72 MHz back as a feedback signal via a feedback loop 13. The feedback loop 13 contains a level converter 14 in the analog part 21 for converting from the low-voltage pseudo-ECL level to the low-voltage CMOS level, and also contains a step-down device 15 fashioned as a 1:15 divider in the low-voltage CMOS part 22 in order to in turn obtain a signal with the frequency of 2048 KHz. This signal is re-supplied to the phase detector 8 as a feedback signal.

The low-voltage CMOS divider 22 further contains a synchronizer 18 that receives the frame clock signal FMB2 with 8 kHz at the input side via the line 25 and is synchronized with the signal that is fed back and stepped down by the step-down device 15. The output signal of the synchronizer 18, which is already decoupled in phase from the phase of the frame clock signal FMB2 of the input side, is supplied via a level converter 17 in the analog part 21 for conversion from the low-voltage CMOS level to the low-voltage pseudo-ECL level to a phase element 16 in the low-voltage pseudo-ECL part 23 that, for example, phase drive, receives the output signal of the divider 72 or of an identical divider as well as the output signal of the divider 71 (i.e., the high-frequency clock signal with 92.61 MHz) in order to, initially roughly, and then finely, match the phase relation of the frame clock signal FMB92 with 8 kHz output via the line 27 to the clock signal CLK92 output via the line 26 using these signals and two ultra-fast flipflops in the phase element 16. The functioning is explained in greater detail below.

Low-voltage technology for, in particular, a 3.3 V supply voltage is employed for the entire second function stage 2, namely for the CMOS part 22, for the pseudo-ECL part 23, as well as for the analog part 21. As a result, noise level and dissipated power are essentially reduced. The division of the components onto the CMOS part 22 and the pseudo-ECL part 23 effects that time-critical functions are realized in the low-voltage pseudo-ECL part 23 and gate-intensive functions are realized in the low-voltage CMOS part 22. Functions of a nature alien to the clock and signals alien to the clock as well are kept away from the entire area of the second function stage 2. Expediently, the functions in the low-voltage CMOS part 22 are realized with standardized, electrically programmable logic fields (FPGA), whereas the functions in the low-voltage pseudo-ECL part 23 are realized with the assistance of ultra-fast, discrete components. The connection of the interfaces of these two parts 22 and 23 ensues via the analog part 21, namely via mainly passive components, resulting in an enhancement of the immunity of the overall system to noise influences. The necessary power supply of the individual parts 21, 22 and 23 is expediently implemented in an island-like manner, i.e., respectively separately, in order to suppress noise infeeds among one another and from areas of the various parts with foreign clocks.

The analog part 21 of the second function stage 2, i.e., of the 184 MB/s-PLL, contains a discretely constructed VCO 6 (voltage-controlled oscillator) with a Colpitts sine oscillator for 184 MHz as a critical component. This oscillator is advantageous because it is immune to noise influences due to the high signal level at the resonant circuit that can be realized in the low-voltage domain. It is also advantageous that the output signal has only slight noise and exhibits high spectral purity because of the high resonant quality that can be achieved. By suitably selecting the components of the resonant circuit in view of manufacturing deviations, temperature constancy, aging constancy and the like, it is not only very highly self-stabile but also assures a dependable response of the sine oscillator in the VCO 6. A frequency stability, including the tolerances required in the layout, of ±4% can be currently achieved with traditional components.

A further selection criterion of the VCO 6 is the pull-in steepness, which should be as slight as possible. This results in adequately limiting namely the parasitic frequency modulation of the PLL that is essentially caused by the unavoidable ripple of the phase detector 8 as well as the maximum upward frequency deviation of the VCO 6. This fail-safe behavior avoids, in case of a fault, an overheating of the ASICs operated with the high-frequency clock in CMOS technology of the $4^{th}$ function stage 4.

The pull-in range for the VCO 6 is derived from the allowable self-tolerance and from the reserve margin for the necessary control, assuming a jitter-free and crystal-stable pilot signal. Furthermore, the control voltage limit of the low-voltage range, namely 3.3 V, must be considered. Taking these conditions into consideration, a pull-in steepness of So=3.3%/V±20% is expediently specified for the VCO 6 as realistic.

The conversion of the sine level output by the VCO 6 into the low-voltage pseudo-ECL level in the low-voltage-ECL part 23 ensues in the converter 7, namely with an ultra-fast comparator 73 which is followed by the dividers 71 and 72 in integrated technology. Due to the high analog gain of the comparator 73 and due to the already defined, adequate steepness of the sine signal in the zero-axis crossing (of approximately 1 V/ns), an extremely low-jitter and low-distortion conversion is achieved. As a result of this, the noise sensitivity becomes extraordinarily low and achieves approximately 1 ps phase jitter per 1 mV noise level at the decision threshold. The comparison in the comparator 73 ensues with an internal reference signal 74, which is indicated with an arrow. For example, the module MC100LVEL of the Motorola company can be employed as converter 7. This module employs two low-voltage pseudo-ECL outputs with 1:2 division and two further outputs that can be configured in view of a 1:4 or 1:6 division. The output signal of the 1:2 divider 71 is the output-side clock signal CLK92 of the second function stage 2. This output signal is a symmetrical 92.16 MHz signal at the low-voltage pseudo-ECL level. The output signal of the divider 72 configured 1:6 here is a symmetrical 30.7 MHz signal that is employed via the feedback loop 13. A corresponding signal for the rough setting of the phase relation of the frame clock signal FMB92 is also employed by the phase element 16 from the output of this 1:6 divider 72 or of a further divider of the converter 7 configured in the same way. The 30.72 MHz signal fed back via the feedback loop 13 is converted in the analog part 21 with the level converter 14, where the converter 14 is constructed of completely passive components (resistors, capacitors and high-frequency transformers), which prevents the creation of a new source for jitter or for noise introduction.

The decoupling of the input-side frame clock signal FMB2 from the output-side frame clock signal FMB92 that ensues in view of the phase relation allows a critical simplification of the structure of the second function stage 2, since a control element that works proportionally and is realized in a simple way, namely a PLL of the 1$^{st}$ order, can be employed for the frequency conversion of the clock signal CLK2 to the clock signal CLK92.

The maximally possible phase deviation of the proportional control element from the pilot quantity is defined by the phase detector depth. This can already be taken into consideration in the definition of the reference frequency. It is particularly advantageous that no active loop filter (as low-pass filter 9) need be employed; rather, a passive loop filter can be employed, resulting in the elimination of a further possible noise source for the PLL.

The phase coupling to the clock signal CLK92 is enabled by a reserve for the phase relation between the frame clock signal FMB2 and FMB92 on the order of magnitude of approximately ±1 µs for the frame clock signal FMB92. As a result, the synchronization and the monitoring of the synchronization for the input-side frame signal FMB2 can ensue in the low-voltage CMOS part 22, this resulting in low power expenditure, space requirements, and cost outlay.

Only the setting of the phase relation of the signal with 8 KHz generated in the low-voltage CMOS part 22 and output by the synchronizer 18 ensues in the low-voltage pseudo-ECL part 23, where the conversion from the low-voltage CMOS level onto the low-voltage pseudo-ECL level can ensue in the converter 17 in the analog part 21 in the same way, with simple components, as in the level converter 14. The phase element 16 contains only two ultra-fast flipflops that are driven with the assistance of the feedback signal of 30.72 MHz by the divider 72, on the one hand, and of the clock signal CLK92 with 92.16 MHz by the divider 71, on the other hand.

It is critical for the design of the phase detector 8 that it have the maximum possible bandwidth for PLL transfer functions in order to reduce the control inertia. Since, as mentioned, the steepness of the VCO 6 should be low because of the jitter and noise minimization and the loop or low-pass filter 9 should be constructed of passive components, it is expedient to employ an exclusive-OR element as a phase detector 8 that enables this maximum steepness. Given such a structure of the phase detector 8, it is also advantageous that the low-pass filter 9 necessarily exhibits higher attenuation at higher frequencies. The phase shift by 90° (ideal position) conditioned by the principle of this structure as well as additional, environment-conditioned phase offsets of the proportional control element in the entire range of the phase detector depth (0–180°) is compensated by a compensation memory for the data that is usually present. These memories (not shown in detail) are not dynamically loaded because the PLL (of the second function stage 2) behaves very stably in its operating point found at the moment.

The position of the input-side frame clock signal FMB2 relative to the output-side clock signal CLK92 is kept correct by the synchronization in the synchronizer 18 with the feedback signal. In the way explained above, moreover, the frame synchronism in the high-frequency range is always assured.

Further conditions should also be expediently observed in the design of the phase detector 8, particularly in view of the definition of the PLL comparison frequency. Due to the systematic jitter modulation of the PLL (as a result of jitter), it is expedient to keep the comparison frequency as high as possible. Capture problems, in contrast, are not expected given a proportional control element. On the other hand, the phase detector 8, which is realized in the low-voltage CMOS part 22, is still in the position with its limited working speed to output a control voltage proportional to the input phase relation. Finally, the upper quantity for the comparison frequency is defined by the running times in the low-voltage CMOS part 22 for the phase-in of the 8 KHz frame clock signal (on the signal path of feedback loop 13, converter 15, synchronizer 18, converter 17 and phase element 16).

The reliable operating speed of commercially obtainable FPGAs cost-beneficially realized in low-voltage CMOS technology is currently in a frequency range of 30–50 MHz. For this reason, the selected feedback signal is expedient with a frequency of 30.72 MHz, as output by the configured 1:6 divider 72. Due to the 1:15 division of the step-down device 15 constructed in FPGA technology, a signal with an optimum comparison frequency of 2048 KHz then derives from this 30.72 MHz feedback signal. It is advantageous that a whole-numbered division ratio is achieved within the step-down device 15. As a result, the feedback signal employed for the phase detector 8 fashioned as an exclusive-OR element can be realized with a 1:1 pulse-duty factor, and the entire control characteristic of the phase detector 8 can be used without limitations for the PLL. For this comparison frequency of 2048 MHz, a phase detector depth of 244 ns (φ=122 ns±122 ns) derives for the control. Corresponding reserves can be defined without difficulty in the compensation memory previously mentioned.

The loop filter fashioned as a low-pass filter 9 is realized with passive components. A two-stage RC element that allows optimum ripple suppression is expedient. For improving the noise sensitivity, the first stage is arranged directly at the output of the converter 15 in the FPGA structure, whereas the second stage is already arranged in the region of the layout for the VCO 6. The dimensioning of the low-pass filter 9 also expediently considers the optimum attenuation of the PLL (ξ=0.7) taking the modulation bandwidth of the VCO 6 into consideration. Thus, it follows that, expediently, the −3 dB limit frequency of the low-pass filter should lie above the corner frequency of the proportional control element by at least a factor of 2, this proportional control element being formed of the phase detector 8 and the VCO 6 with the following frequency divider 71, 72. The corner frequency of the controller can be calculated from the parameters f0/N=2048 KHz, Kd=3.3 V/π and Ko/ωo=3.3%N (with f0=oscillator frequency of the VCO 6, N=entire division ratio in the feedback loop 13, Kd=gain factor of the phase detector 8, Ko=oscillator steepness in the VCO and ωo=radian frequency of the oscillator in the VCO 6) and derives as $F_{PLL1,0}$.70 KHz (typical).

Proceeding from this and in order to achieve the required attenuation for the ripple frequency of 2×2048=4096 KHz given extraordinarily low system jitter of the PLL, the −3 dB limit frequency of the low-pass filter 9 is expediently defined advantageously $f_{LF}$ (typical)≈200 KHz. Worst case fluctuations of the supply and of the previously mentioned VCO target steepness are also considered. This results in a signal attenuation of the two-stage low-pass filter of approximately 46 dB being achieved at the ripple frequency of 4096 KHz. The ripple part of the system jitter of the PLL is thus limited to about 25 ps.

The desired result can be achieved by traditional components intentionally selected on the basis of the boundary conditions in the functions arranged in various regions according to the invention. In particular, phase synchronism and integrity of the data streams in the individual channels is assured on site. A phase compensation in the high-frequency range between the incoming data streams with 184.320 MB/s relative to the local system clock ensues in the sub-nanosecond range on every channel, as a result of which a transfer of the data onto the local level in the 184.320 mB/s region is assured free of bit errors. Over and above this, the phase shifts existing between the individual channels are also compensated. These phase shifts can arise due to skew and temperature effects, due to unbeneficial wiring or the like. The compensation is implemented in a region of 20 bits. The specific allocation to various technology fields achieves the satisfaction of the extreme jitter demands as well as a far-reaching immunity to noise influences.

The indicated frequencies are to be understood as being by way of example, even though these are a matter of the currently standard or currently planned frequencies. This also applies to the division ratios, the limit frequency of the loop filter and the oscillator frequency of the VCO. The above-described arrangement is illustrative of the principles of the present invention. Numerous modifications and adaptations thereof will be readily apparent to those skilled in this art without departing from the spirit and scope of the present invention.

What is claimed is:

1. An arrangement for a clock supply of high bit-rate switching network structures in a digital narrowband switching system, comprising:

a PLL system comprising a crystal-controlled oscillator that locks a switching network clock to a clock phase generated by a central clock generator and outputs a low-voltage normal bit-rate, low frequency, clock signal and a low-voltage frame clock signal for normal bit-rate switching network structures;

an analog, discrete sine oscillator in a phase-locked loop that converts said normal bit-rate clock signal into a high-frequency clock signal; and a low-voltage pseudo-ECL arrangement, that, after stabilization with a reference clock, generates a high bit-rate, high frequency, clock signal suitable for high bit-rate switching network structures by division and outputs it, said low-voltage pseudo-ECL arrangement also outputting an output-side high bit-rate, high frequency, frame clock signal of the same frequency decoupled in phase position from an input-side frame clock signal that has a predetermined phase relation relative to said high bit-rate clock signal.

2. The arrangement according to claim 1, further comprising:

a feedback path via which a clock signal, that is a feedback signal, that has been stepped-down in frequency as well as converted in level can be fed back to an input-side phase detector contained within a low-voltage CMOS arrangement that also receives said normal bit-rate clock signal.

3. The arrangement according to claim 2, further comprising an ultra-fast comparator with a high analog gain, said ultra-fast comparator comprising a following, integrated frequency divider with two differing division rates for an output of said high bit-rate clock signal and of said feedback signal.

4. The arrangement according to claim 3, wherein said ultra-fast comparator with a high steepness for a sine signal in a zero-axis crossing has a steepness of approximately 1 V/ns.

5. The arrangement according to claim 2, further comprising a level converter in said feedback path, said level converter consisting of passive components and serving for a conversion of low-voltage pseudo-ECL level onto low-voltage CMOS level.

6. The arrangement according to claim 2, wherein:

said phase detector comprises an exclusive-OR element; and a step-down device in said low-voltage CMOS arrangement is provided in the form of an electrically programmable gate array that further-converts said feedback and level-converted signal into a signal having a pulse-duty factor 1:1 that is supplied to said exclusive-OR element.

7. The arrangement according to claim 1, further comprising:

a two-stage, passive low-pass filter preceding said analog sine oscillator and having a −3 dB limit frequency of at least 2 times the corner frequency of a pure proportion control element part of a control loop of said arrangement without a low-pass filter.

8. The arrangement according to claim 2, further comprising:

a clock distributor arrangement in said low-voltage pseudo-ECL arrangement that receives said high bit-rate clock signal and said high bit-rate frame clock signal coupled to it in phase position at its input side and divides these in pairs onto numerous output pairs.

9. The arrangement according to claim 8, further comprising low-voltage pseudo-ECL components with low skew that are selected such that a required system jitter that is reached in said low-voltage pseudo-ECL arrangement, said low-voltage CMOS arrangement, and said clock distributor arrangement lies on the order of magnitude of ±200 ps.

10. The arrangement according to claim 1, further comprising:
a low-voltage application-specific or customer specific integrated circuit (ASIC) in a low-voltage CMOS arrangement, said ASIC having integrated into it:
a gate array arrangement;
an analog PLL; and
a comparator that is supplied by said high bit-rate clock signal and said high bit-rate frame clock signal coupled to it in phase position, said comparator having difference outputs that supply said analog PLL for converting an input-side clock frequency to double that and for, in turn, its distribution of this clock frequency with said gate array arrangement.

11. The arrangement according to claim 1, wherein:
said low-frequency clock signal frequency is approximately 2048 KHz;
said high-frequency clock signal frequency is approximately 92.162 MHz; and
said high-frequency frame clock signal frequency is approximately 8 KHz.

12. The arrangement according to claim 3, further comprising a level converter in said feedback path, said level converter consisting of passive components and serving for a conversion of low-voltage pseudo-ECL level onto low-voltage CMOS level.

13. The arrangement according to claim 3, further comprising:
a phase detector that comprises an exclusive-OR element; and
a step-down device in said low-voltage CMOS arrangement in the form of an electrically programmable gate array that further-converts said feedback and level-converted signal into a signal having a pulse-duty factor 1:1 that is supplied to said exclusive-OR element.

* * * * *